(12) United States Patent
Hebert (10) Patent No.: US 6,180,995 B1
(45) Date of Patent: Jan. 30, 2001

(54) INTEGRATED PASSIVE DEVICES WITH REDUCED PARASITIC SUBSTRATE CAPACITANCE

(75) Inventor: Francois Hebert, San Mateo, CA (US)

(73) Assignee: Spectrian Corporation, Sunnyvale, CA (US)

( * ) Notice: Under 35 U.S.C. 154(b), the term of this patent shall be extended for 0 days.

(21) Appl. No.: 09/306,477

(22) Filed: May 6, 1999

(51) Int. Cl.[7] .................................................. H01L 29/00
(52) U.S. Cl. ............................................ 257/531; 257/528
(58) Field of Search ..................................... 257/528, 531

(56) References Cited

U.S. PATENT DOCUMENTS

| | | | |
|---|---|---|---|
| 4,187,516 | * | 2/1980 | Legat et al. . |
| 4,418,470 | * | 12/1983 | Naster et al. . |
| 5,095,357 | * | 3/1992 | Andoh et al. . |
| 5,384,486 | * | 1/1995 | Konno et al. . |
| 5,532,506 | * | 7/1996 | Tserng . |
| 5,742,091 | | 4/1998 | Hébert .................................. 257/531 |
| 5,844,299 | | 12/1998 | Merrill et al. ........................ 257/531 |

OTHER PUBLICATIONS

J.Y.–C.Chang, "Large Suspended Inductors on Silicon and Their Use in a 2–$\mu$m CMOS RF Amplifier," IEEE Electreon Device Letters, vol. 14, No. 5, May 1993.

S.W. Paek and K.S. Seo, "Air–Gap Stacked Spiral Inductor," IEEE Microwave and Guided Wave Letters, vol. 7, No. 10, Oct. 1997.

R.P. Ribas, J. Lescot, J.L. Leclercq, N. Bennouri, J.M Karam, and B. Courtois, "Micromachined Planar Spiral Inductor in Standard GaAs HEMT MMIC Technology," IEEE Electron Device Letters, vol. 19, No. 8, Aug. 1998.

* cited by examiner

Primary Examiner—Stephen D. Meier
(74) Attorney, Agent, or Firm—Townsend and Towsend and Crew LLP; Henry K. Woodward (57) ABSTRACT

A method of forming high quality inductors and capacitors in semiconductor integrated circuits utilizes one or more sealed air-gaps in a supporting substrate under the passive devices. The process is compatible with standard silicon processing and can be implemented with high temperature processing at the beginning, middle, or end of an integrated circuit fabrication process. A one micron air-gap in a high resistivity epitaxial layer results in a parasitic capacitance equivalent to 3.9 micron thick silicon oxide or a 11 micron thick depletion layer in silicon.

13 Claims, 14 Drawing Sheets

INTEGRATED PASSIVE DEVICES WITH REDUCED PARASITIC SUBSTRATE CAPACITANCE

BACKGROUND OF THE INVENTION

This invention relates generally to electronic integrated circuits (ICs) and more particularly the invention relates to passive devices such as inductors and capacitors of an IC having reduced parasitic substrate capacitance.

The quality, Q, of inductors and capacitors is a strong function of the losses within such devices. Losses can be caused by parasitic series resistances or parasitic shunting capacitances for example. High quality IC inductors and capacitors are required in order to realize on-chip matching elements, narrow-band circuits, filter networks, and transformers, for example. However, typical integrated inductors and capacitors on silicon substrates have low quality factor due to the parasitic capacitance with the substrate. The typical Q for a silicon substrate is in the range of 3 to 6 . In high power RF applications, higher quality elements are required in order to minimize power losses since the parasitic capacitance will shunt to the substrate some of the RF signal.

Figure 1A:
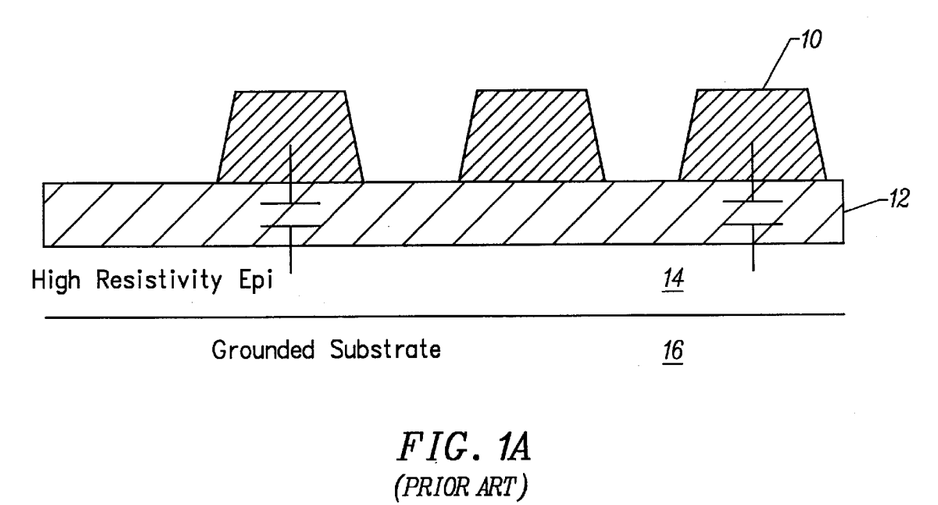
FIGS. 1A, 1B are a section view and a schematic of electrically inductors of an integrated circuit in accordance with the prior art.
Figure 1B:
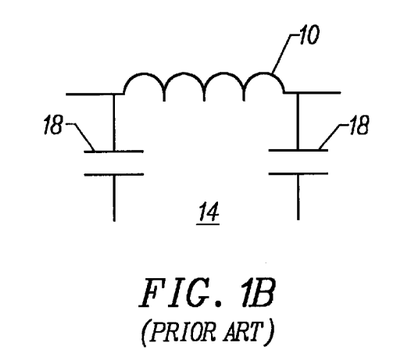

IC inductors consist of metal spirals formed on thick oxides and high-resistivity epitaxial silicon substrates. The high dielectric constant of the layers under the spiral inductor result in significant parasitic capacitance. See FIGS. 1A and 1B which are a section view of a metal spiral inductor 10 formed on a thick field oxide 12 on a high resistivity epitaxial silicon layer 14 and grounded substrate 16. As shown in the schematic of FIG. 1B, the inductor 10 has parasitic capacitance 18 with the epitaxial layer 14 and substrate 16. Prior art structures for increasing the quality of inductive devices in an IC include etching the silicon substrate under the capacitive structures and thereby forming a low dielectric constant air gap between the capacitive devices and the substrate. See for example Chang et al."Large Suspended Inductors on Silicon and Their Use in a 2$\mu$m CMOS RF Amplifier" IEEE Electron Device Letters, vol. 14 , No. 5, May 1993; Ribas et al."Micromachined Planar Spiral Inductor in Standard GaAs HEMT MMIC Technology" IEEE Electron Device Letters, vol. 19 , No. 8 , August 1998; Paek et al. "Air-Gap Stacked spiral Inductor" IEEE Microwave and Guided Wave Letter, Vol. 7, No. 10, Oct. 1997. Other techniques used to form high quality inductors with low parasitic capacitance include the use of a thick polyimide material under the inductors. However, this requires complex processing with a back-end process which is not compatible with temperatures greater than 450° C. Additionally, very thick oxides have been used to separate the metal layers from the underlying substrate. However, when film thickness increases, stress increases resulting in cracking and peeling. Further, long deposition times are required. U.S. Pat. No. 5,742,091 to Hebert teaches the formation of deep trenches under inductors to minimize parasitic capacitance.

The present invention is directed to a process and resulting structure for a passive device having high quality and which is compatible with high temperature standard silicon processing which can be implemented at the beginning, middle, or end of an integrated circuit fabrication process.

SUMMARY OF THE INVENTION

In accordance with the invention a passive electrical component structure is fabricated on a major surface of a semiconductor body by forming a field oxide layer on the major surface, at least one patterned metal layer on the field oxide layer which forms the electrical component, and a sealed air-gap formed in the semiconductor body underlying the at least one patterned metal layer. The patterned metal layer can have a generally spiral configuration and function as an inductor, or the at last one patterned metal layer can include a first metal plate spaced from a second metal plate and function as a capacitor.

In fabricating the passive electrical device, a field silicon oxide layer is formed on a major surface of the semiconductor body with a patterned metal layer formed on the field silicon oxide, either before or after other process steps. A plurality of openings are formed through the field silicon oxide and expose the underlying major surface of the semiconductor body which is then isotropically etched to form an air-gap in a semiconductor body under the field silicon oxide. The plurality openings are then sealed with deposited silicon oxide. In a process including formation of an active device having a gate electrode on the major surface of the semiconductor substrate, the step of sealing the plurality of openings can include forming gate passivation for the active device. In one embodiment a plurality of air-gaps can be formed in the semiconductor body underlying the field oxide.

Preferably, the semiconductor body includes a silicon substrate and a high resistivity epitaxial layer with the epitaxial layer having the major surface.

The invention and objects and features thereof will be more readily apparent from the following detailed description and appended claims when taken with the drawings.

DETAILED DESCRIPTION OF ILLUSTRATIVE EMBODIMENTS

Figure 2:
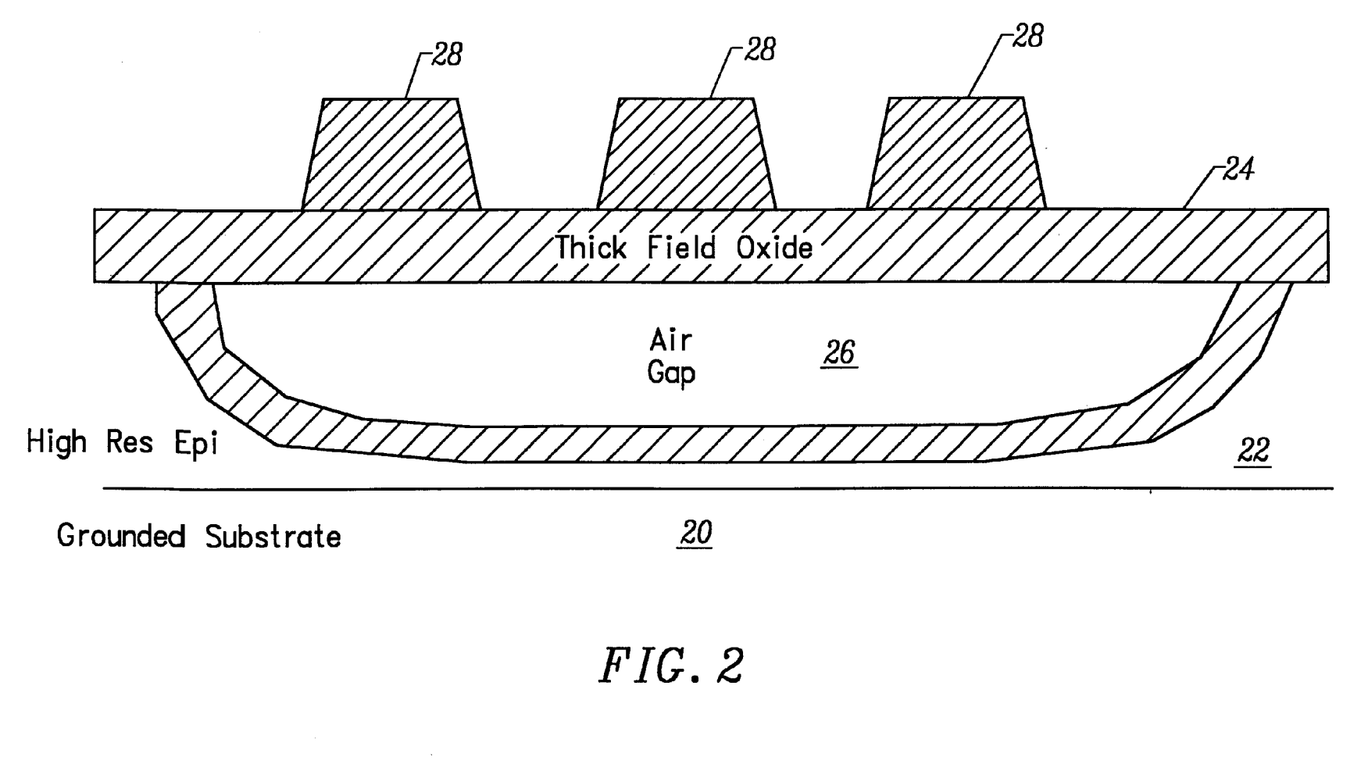
FIG. 2 and FIG. 3 are section views of an inductor and of a capacitor respectively in accordance with embodiments of the invention.
Figure 3:
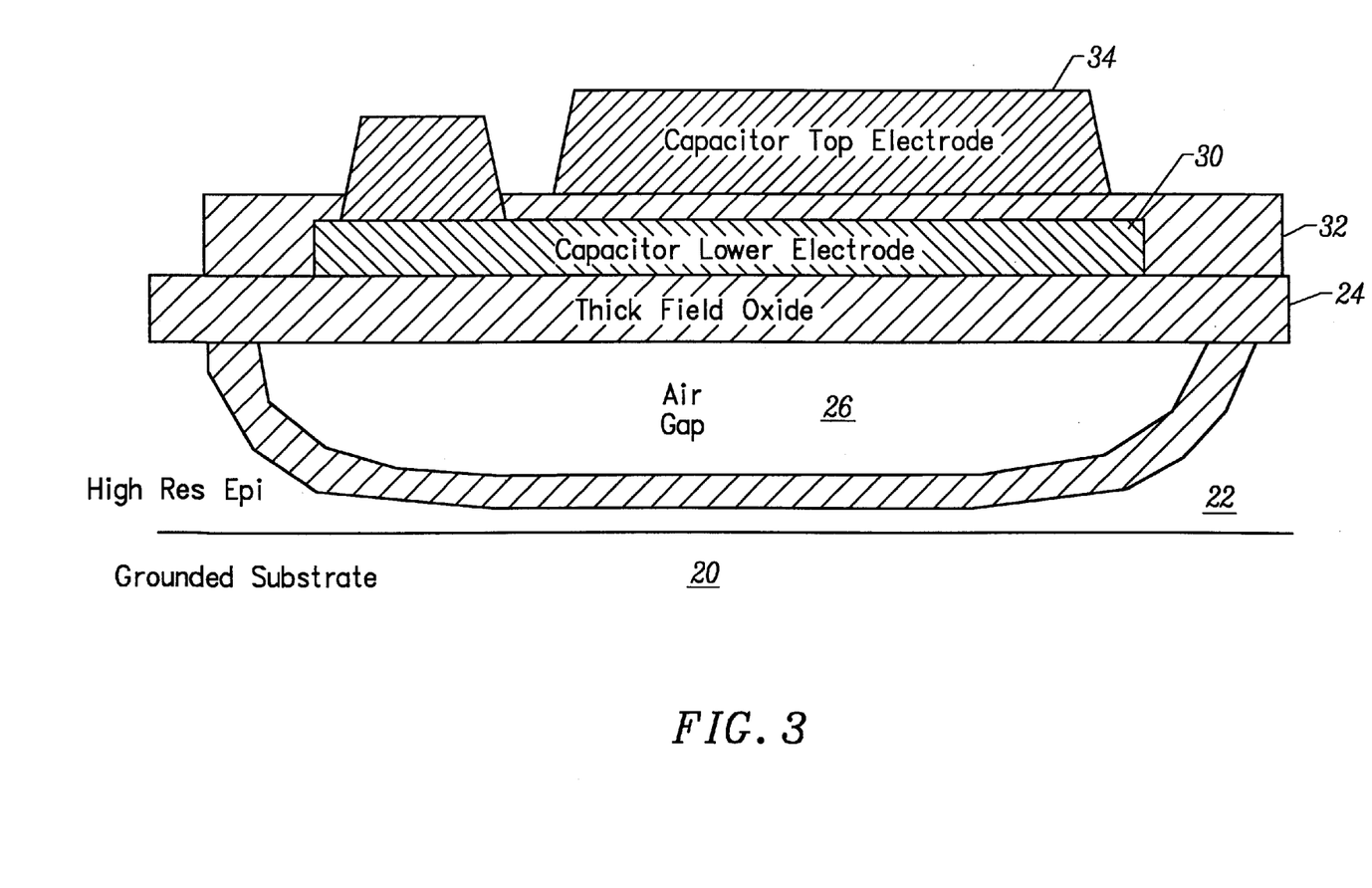

FIGS. 2 and 3 are section views illustrating high quality inductor and capacitors in accordance with embodiments of the invention. In FIG. 2 a silicon substrate 20 has a high resistivity typically in the range of 10–100 ohm-cm (the higher values being preferred) epitaxial layer 22 formed thereon with a thick (i.e. 0.2 to 3.0 microns) field oxide 24 formed on the high resistivity epitaxial layer. Between field oxide 24 and epitaxial layer 22 is a sealed air-gap 26 which underlies a metal spiral inductor 28 formed on field oxide 24. The air-gap is greater than one micron in thickness with the air having a dielectric constant of 1 which is more than 11 times lower than the dielectric constant of silicon. Using conventional semiconductor processing, the air-gap structure can be formed early or late in the fabrication process in accordance with the invention.

FIG. 3 is a section view of a capacitor structure in accordance with an embodiment of the invention. Again, an air-gap 26 is formed between field oxide layer 24 in the high resistivity epitaxial layer 22 on a silicon substrate 20. In this embodiment a lower capacitor electrode 30 is formed on the field oxide 24 and a dielectric such as silicon oxide 32 is then formed over the electrode 30. A top capacitor electrode 34 is formed on dielectric 32 and completes the capacitor structure. A contact 36 is provided through dielectric 32 for contacting the lower electrode 30.

FIGS. 4A–4F illustrate steps in fabricating the structure of FIG. 2. FIG. 4 is a plan view illustrating field oxide 24 in which a plurality of openings 40 are etched to expose the underlying epitaxial layer. The openings are shown as rectangles, but other configurations such as circles, for example, can be used for the openings.

Figure 4A:
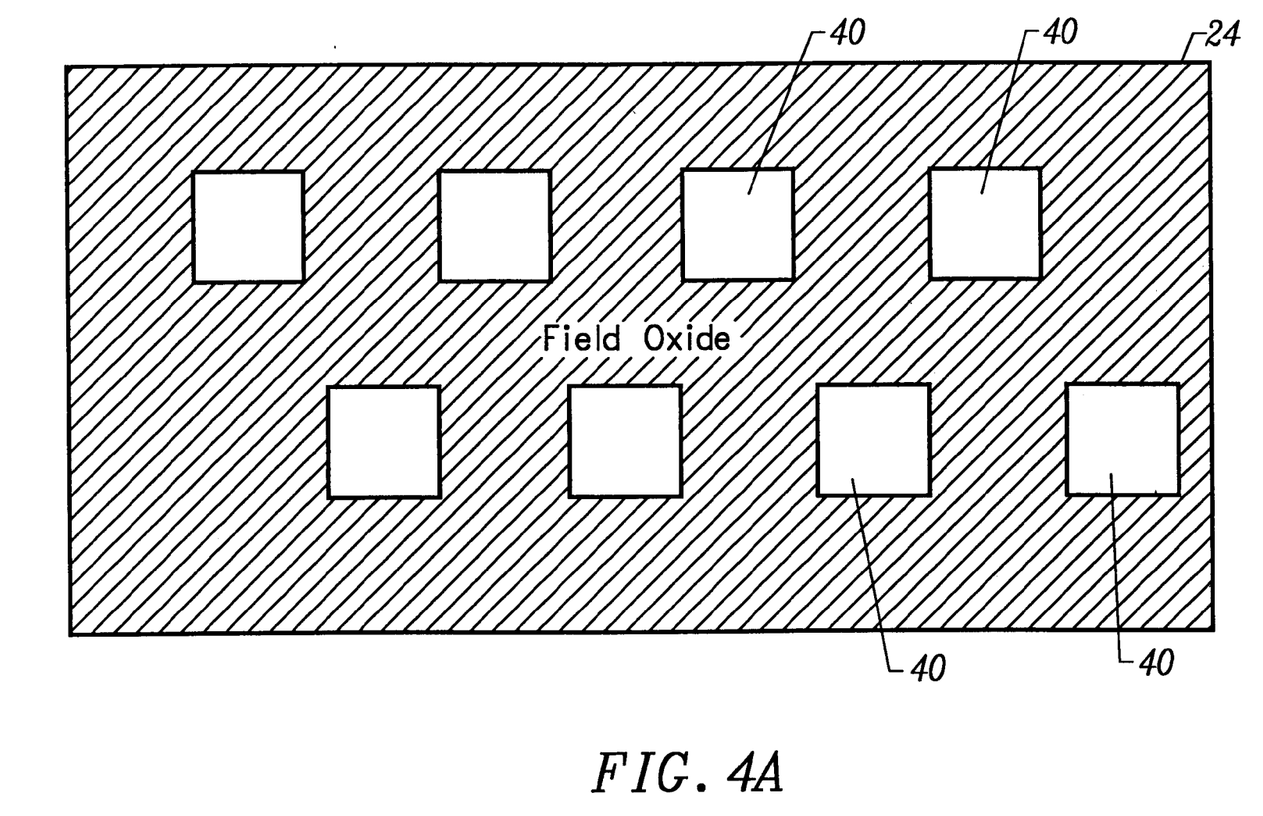
FIG. 4A is a top view and FIGS. 4B–4F are side views illustrating steps in fabricating an inductor in accordance with one embodiment of the invention.
Figure 4B:
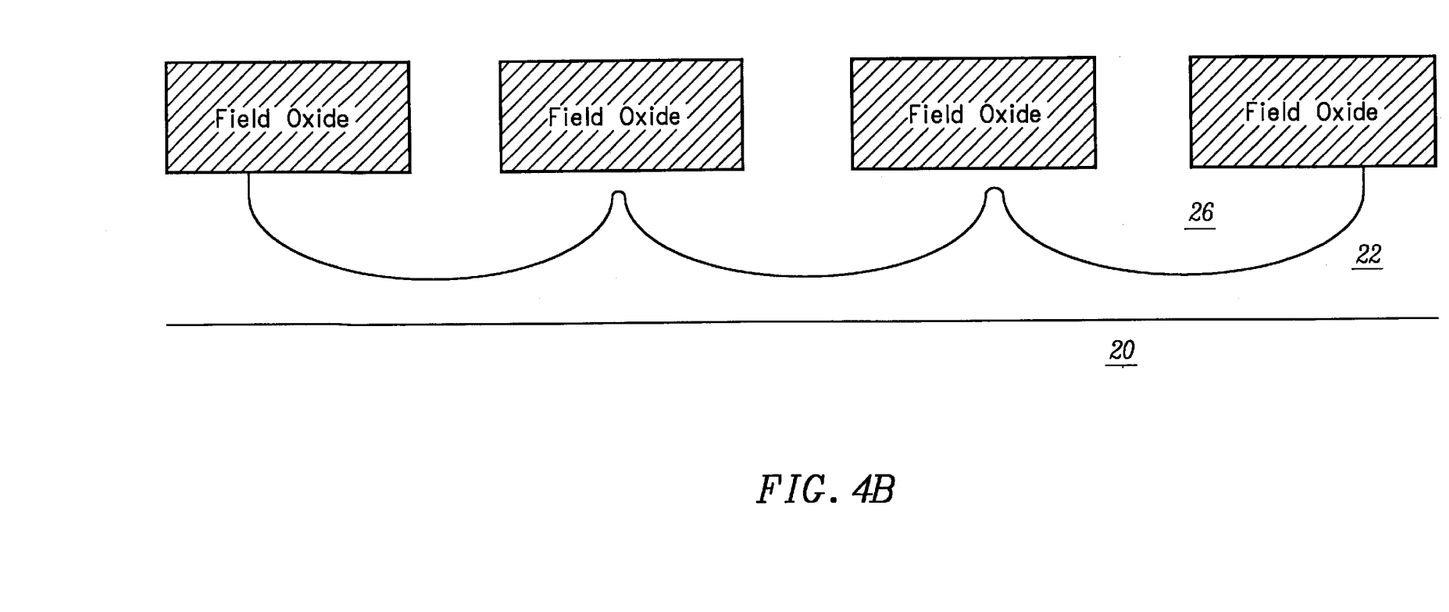

Thereafter, as shown in this section view of FIG. 4B the epitaxial layer is isotropically etched through the openings to form the beginning of air-gap 26. The field oxide thickness is typically 0.2 to 3.0 micron in thickness, 0.5 to 1.5 micron being preferred, and the silicon undercut openings are etched after the field oxide formation, the silicon undercut opening mask patterning and oxide etch. An optional photoresist mask etch can be employed if an oxide hard mask is preferred. Using isotropic silicon etching, the air-gap 26 is formed using standard processing such as SF6 plasma, SF6 resistive ion etching, SF6 downstream plasma, SF6+02 RIE or plasma, or downstream SF6+CF4 plasma, and the like. The etch depth can be in the range of 0.5 to greater than 3 micron. A silicon etch rate on the order of 1 micron per minute can be achieved using SF6 in a RIE reactor.

Figure 4C:
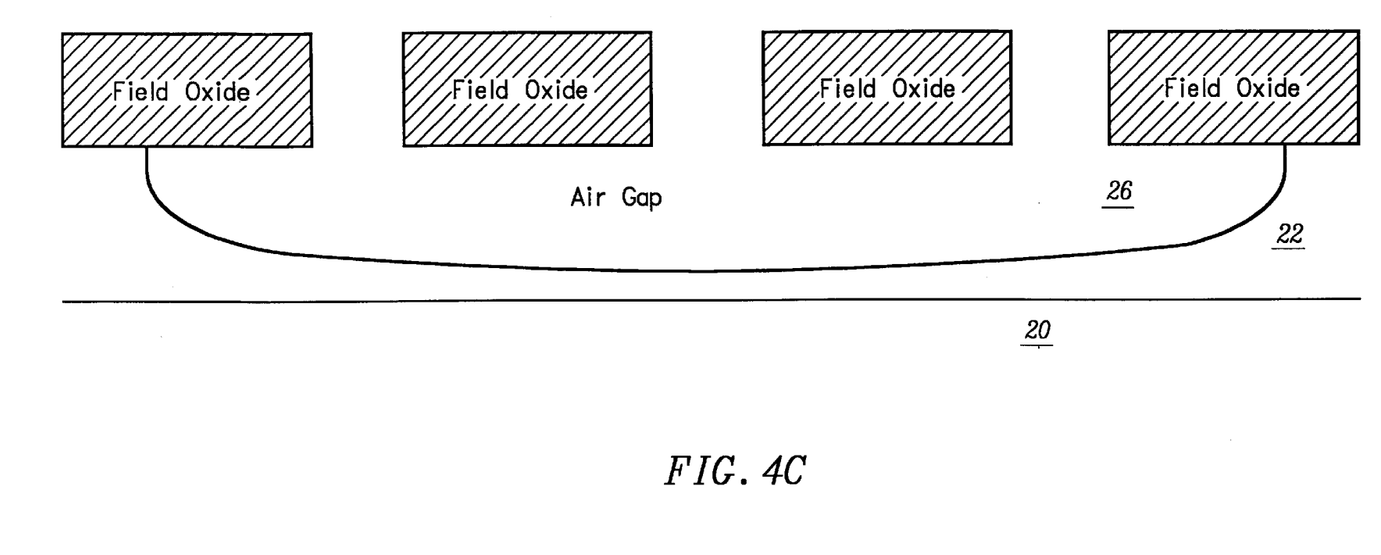
Figure 4D:
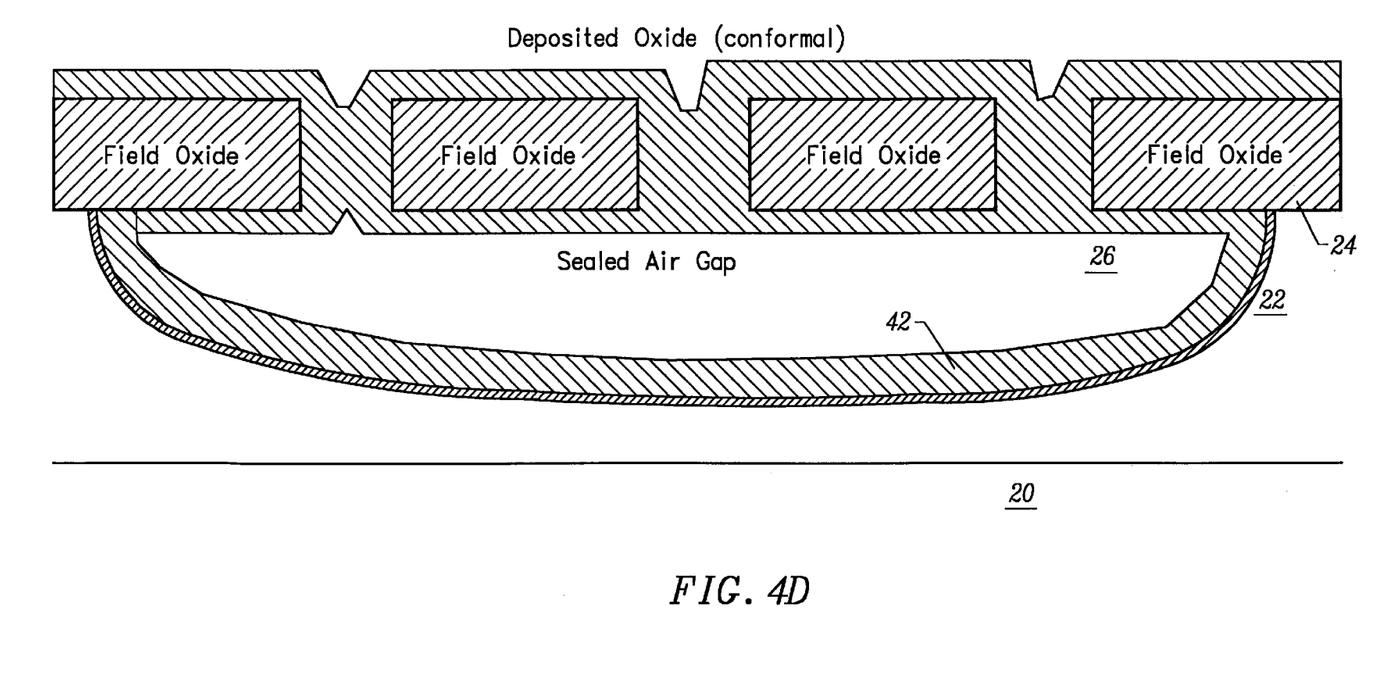

The isotropic silicon etching is continued a shown in FIG. 4C to increase the air-gap in the epitaxial layer, as shown. Thereafter, as shown in FIG. 4D a dielectric such as silicon dioxide is deposited to passivate the interior of the air-gap as shown at 42 and to close the openings through the field oxide. The oxide is typically deposited using low pressure chemical vapor deposition or PECVD equipment. The deposited oxide thickness under the field oxide and on the bottom of the air-gap can be thin since it is used only to passivate the surface. Alternatively, a thermal oxidation process can be employed after the undercut etch in order to passivate the surface.

Figure 4E:
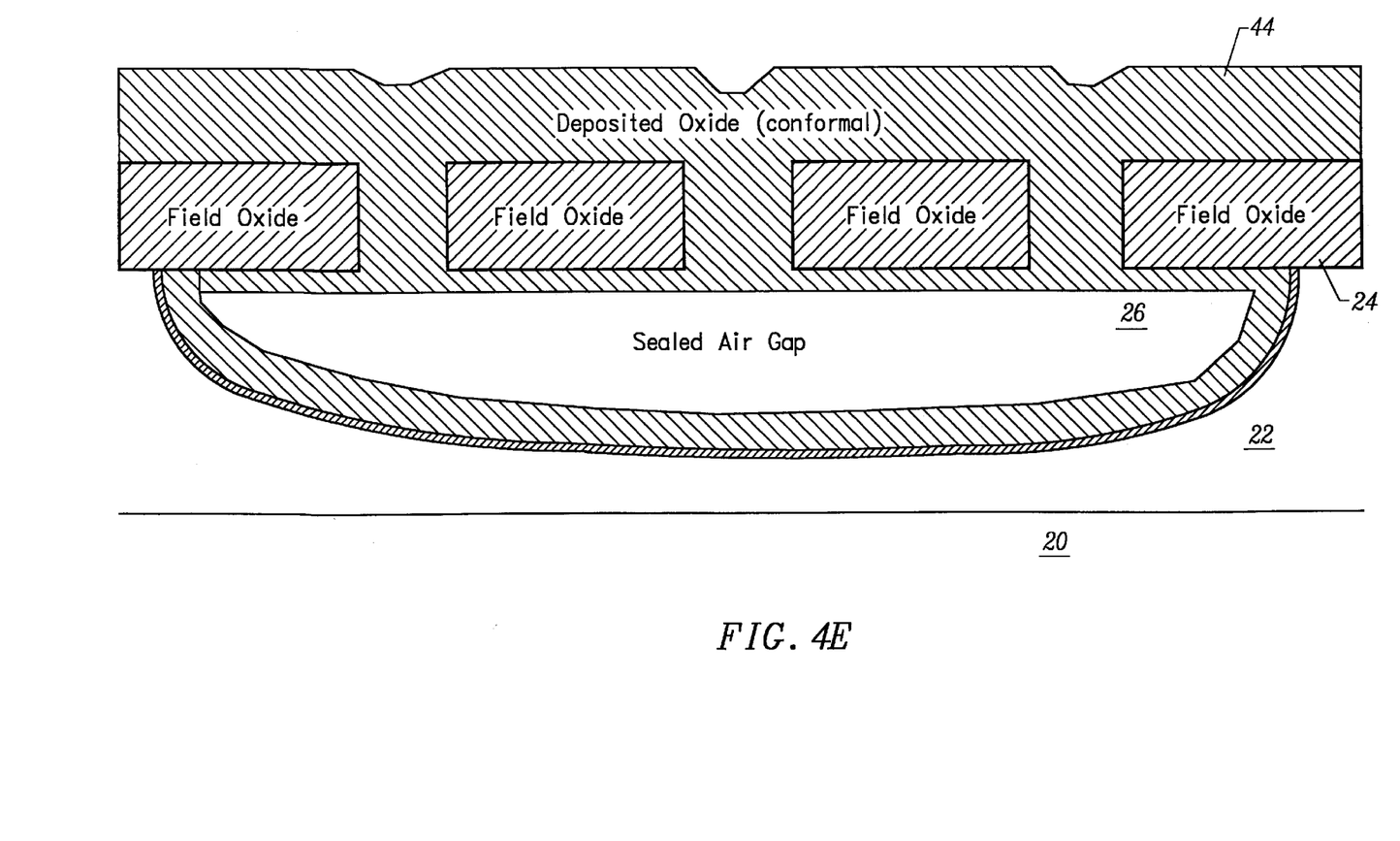
Figure 4F:
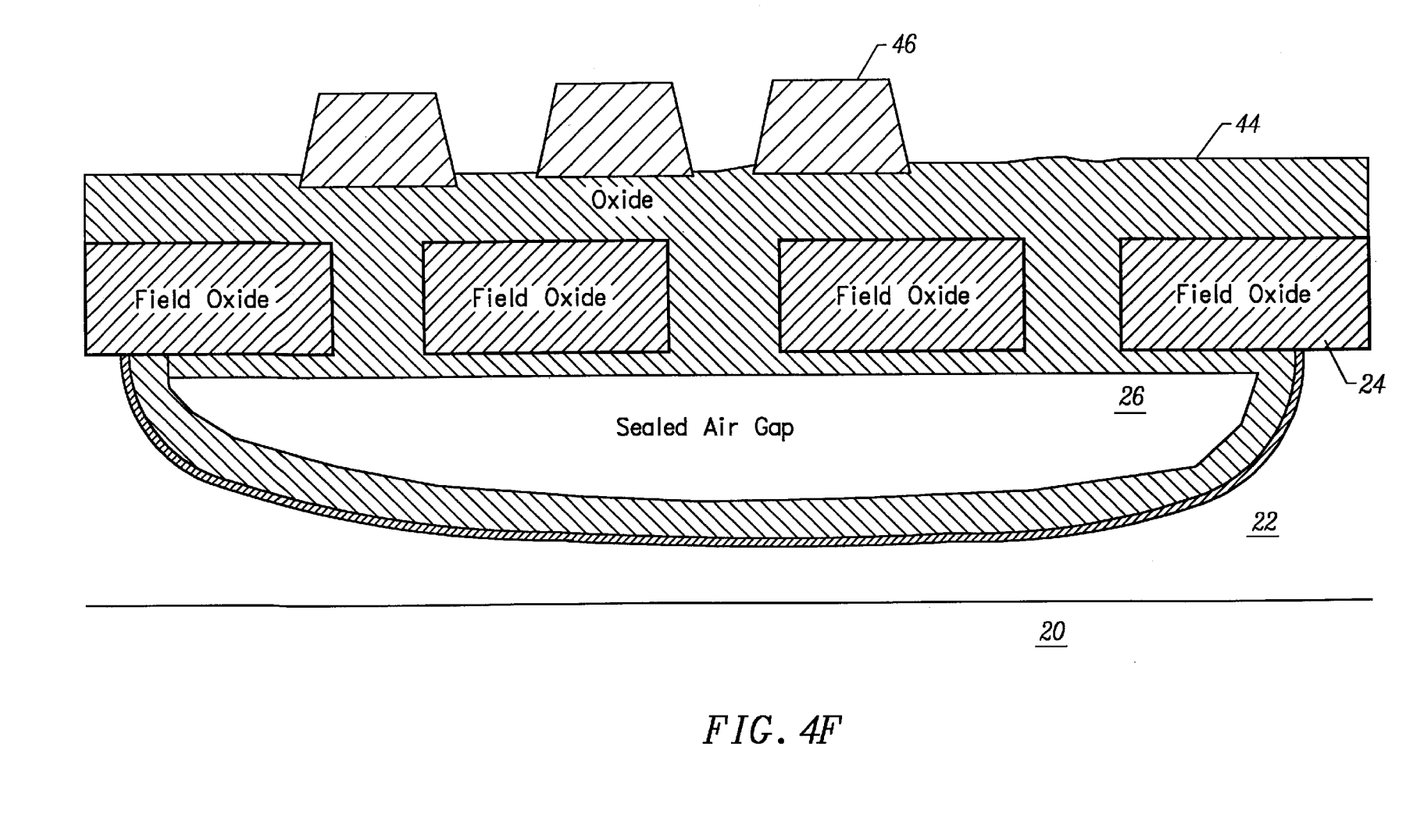

In FIG. 4E the dielectric deposition is continued to planarize the surface as shown at 44 and an optional etch back (RIE or CMP) can be utilized for further planarization of the surface. In FIG. 4F metalization is deposited and patterned to form the inductive spiral 46 and complete fabrication of the passive device. Optionally, a capacitor lower electrode can be formed followed by dielectric formation and an upper capacitor electrode, as shown in FIG. 3.

Figure 5:
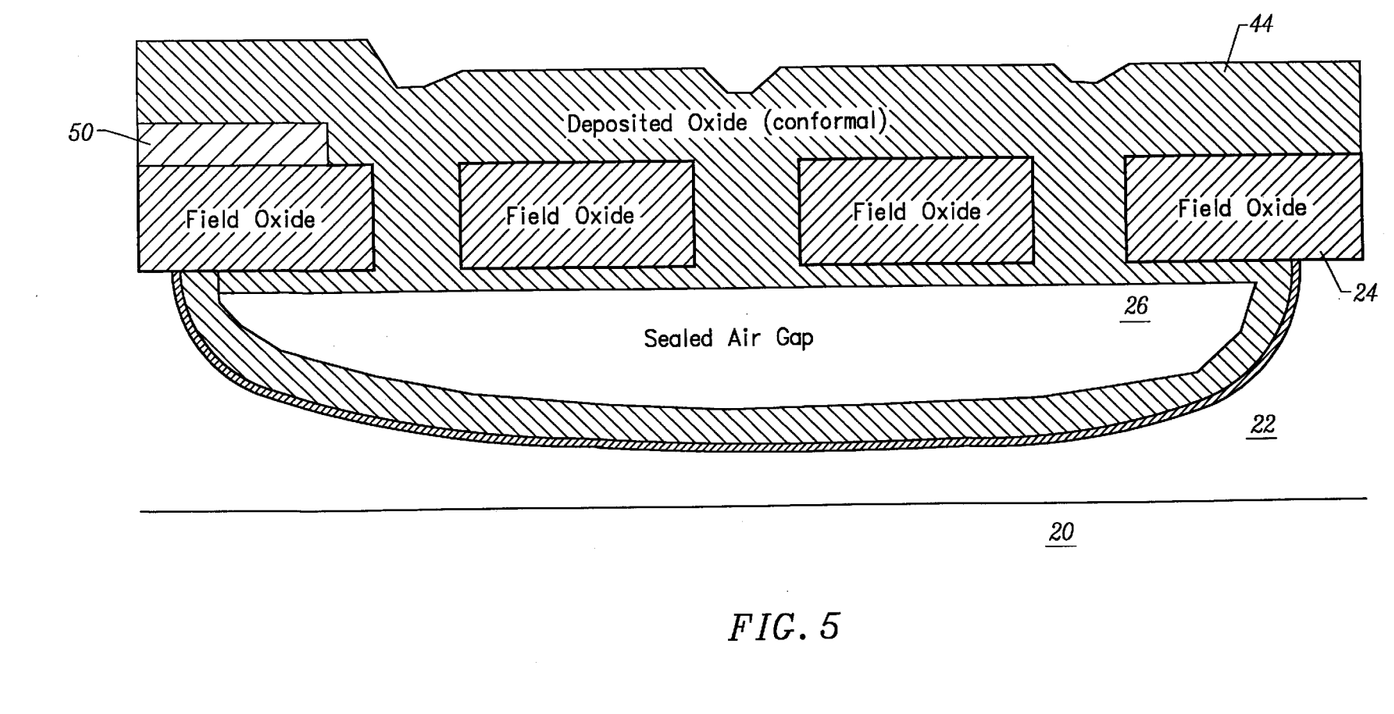
FIG. 5 is a section view of another embodiment of the invention.

FIG. 5 is an alternative embodiment which can be used in a standard RF LDMOS, CMOS, bipolar or BiCMOS process, in which the air-gap is formed after active device formation but before contact formation. The silicon undercut openings are etched after the formation of polycide gate 50 of an active device with the gate passivation used to passivate the air-gap and close the openings. Thereafter the device is completed as shown in FIG. 4F.

Figure 6A:
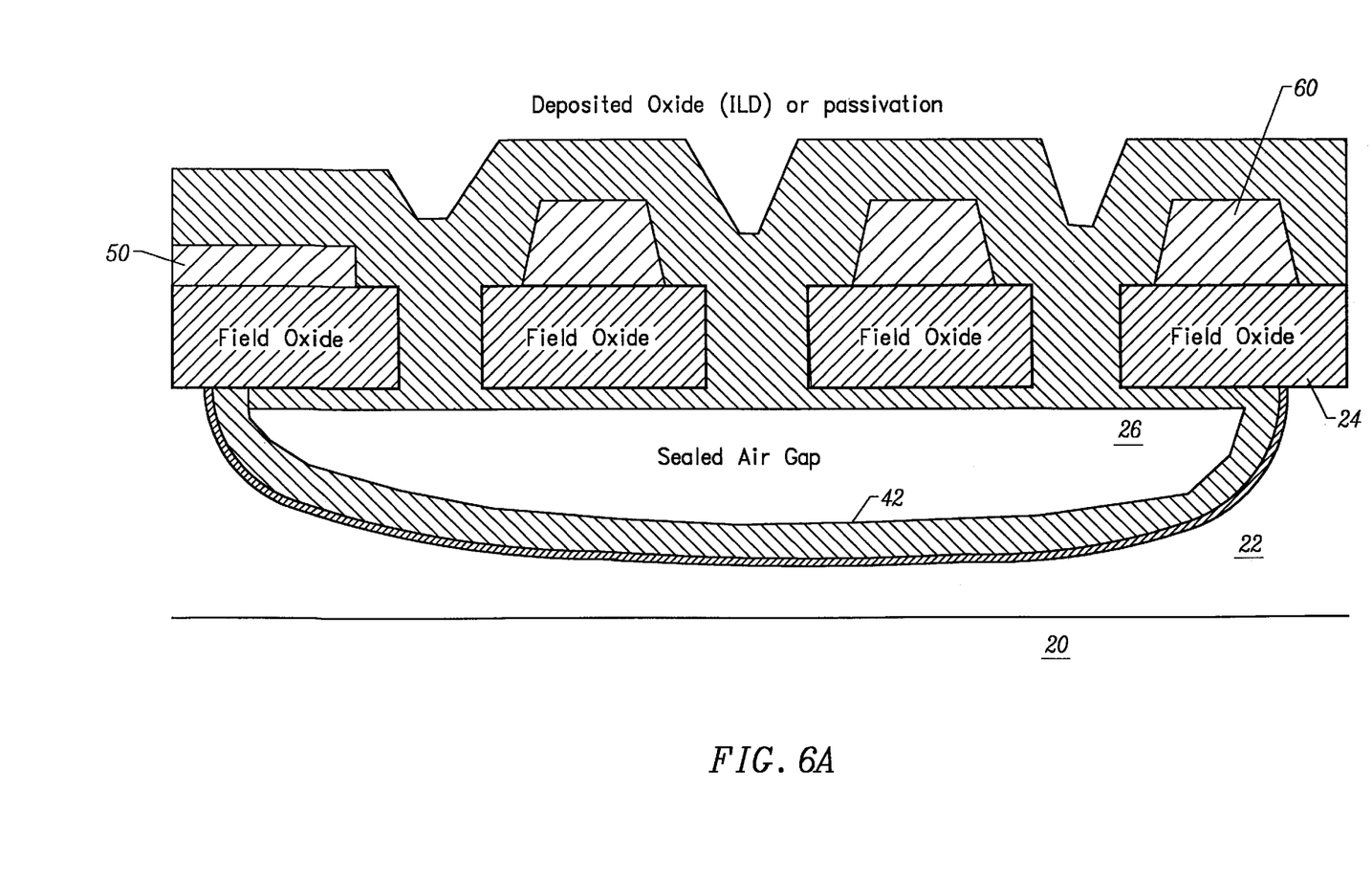
FIGS. 6A, 6B are a section view and a plan view respectively of another embodiment of the invention.
Figure 6B:
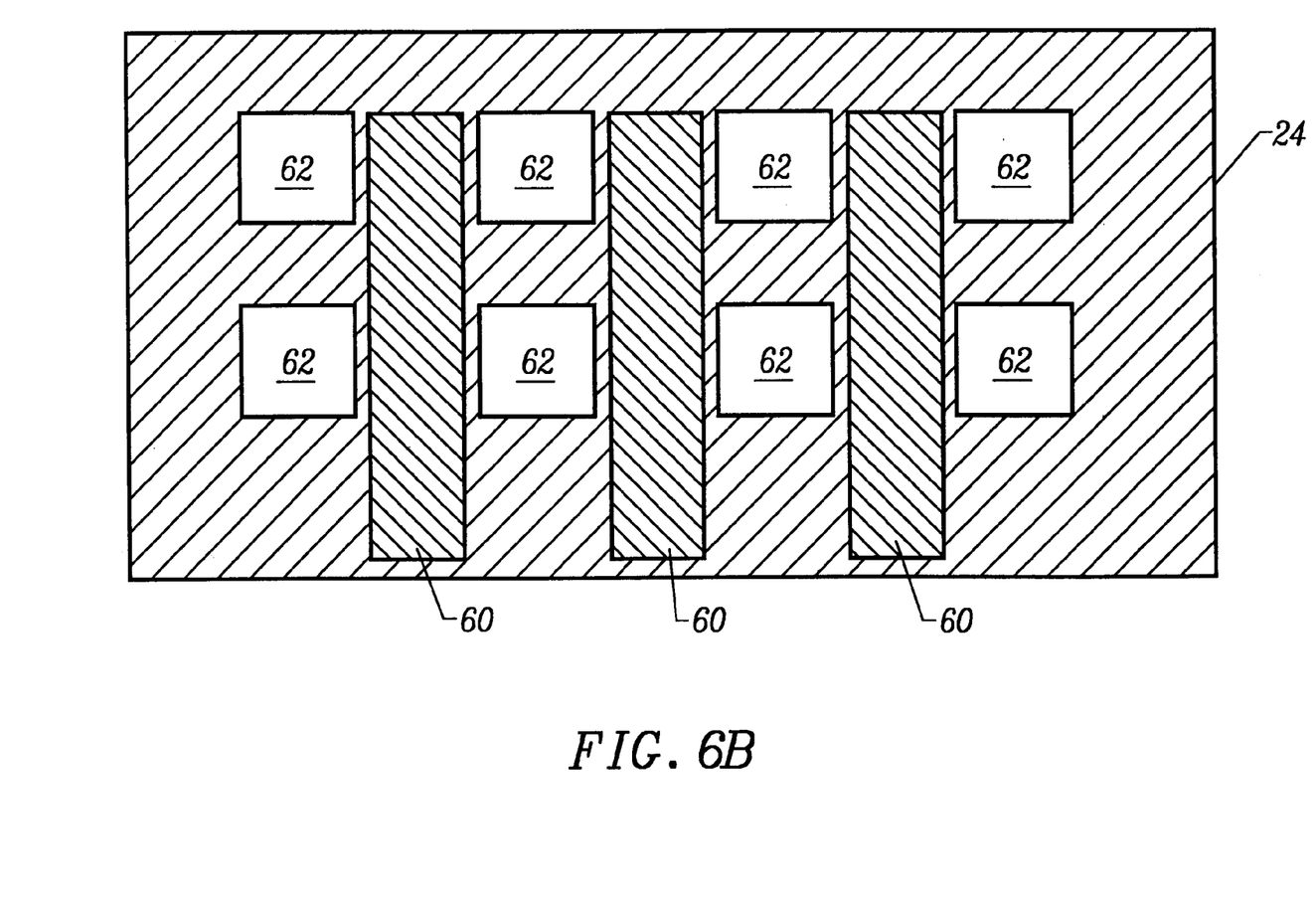

FIGS. 6A, 6B are a section view and plan view of another embodiment as applied to any bipolar LDMOS, or CMOS or BiCMOS process. In this embodiment the air-gap is formed after metalization and later in the process. The silicon undercut openings are etched after metal patterning with the openings patterned between metal lines 60 as shown in the plan view of FIG. 6B.

Figure 7A:
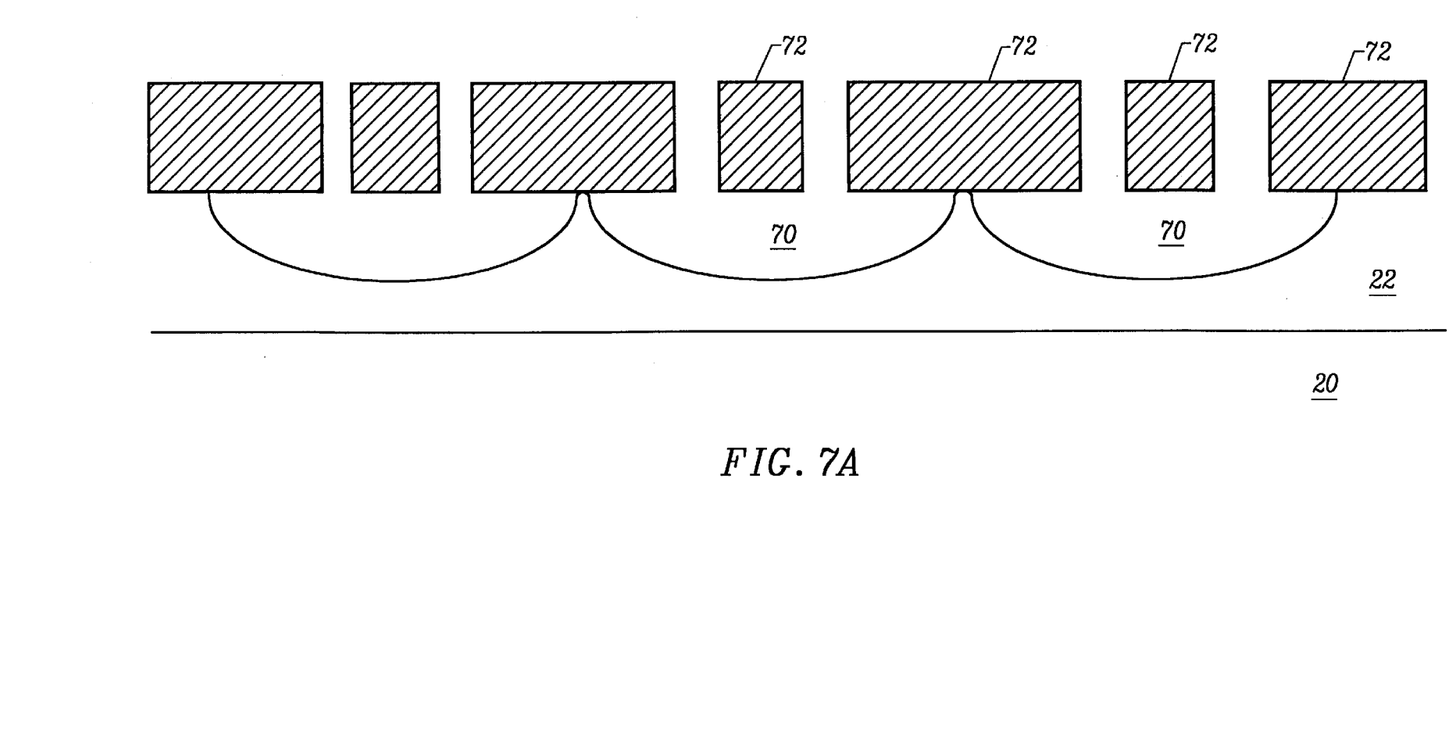
FIGS. 7A, 7B are a section view and a plan view of another embodiment of the invention.
Figure 7B:
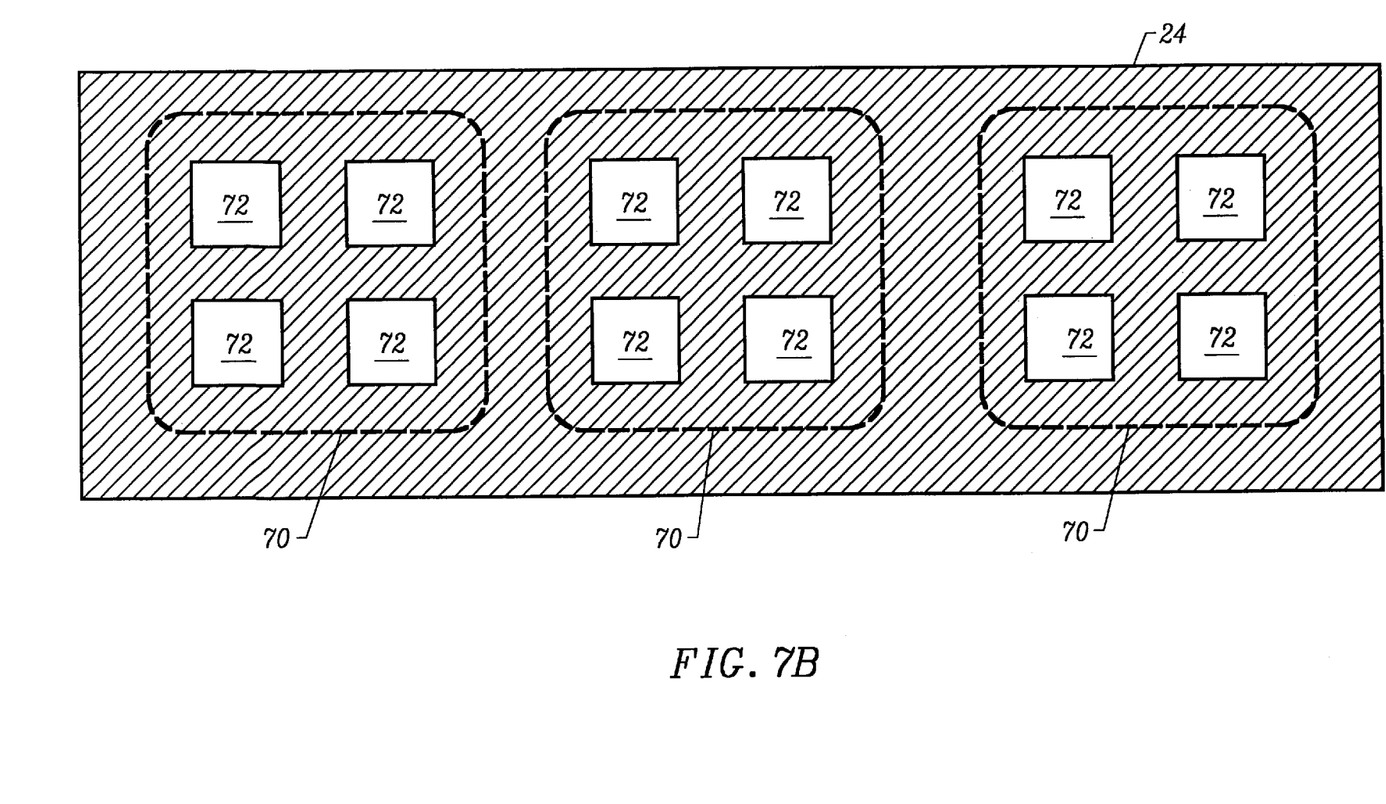

For large area structures such as high value planar capacitors or inductors, the air-gap can be segmented in order to maintain the structural rigidity of the structure. FIGS. 7A, 7B illustrate a section view and a plan view respectively of such a segmented structure. In this embodiment three air-gaps 70 are formed in epitaxial layer 22 through air-gaps 72 in the field oxide 24 as shown in FIG. 7B. FIG. 7A shows the three separate air-gaps after the complete silicon etch but before filling of the undercut holes 72 with oxide.

There have been described several embodiments of passive electrical component structures having reduced parasitic capacitance and higher quality. The process in fabricating the structures is compatible with standard silicon processing using conventional commercially available equipment. The process maintains a planar surface and is compatible with high temperature processing at the beginning, middle or end of an integrated circuit fabrication process. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A passive electrical component structure comprising
   a) a semiconductor body having a major surface,
   b) a field oxide layer formed on the major surface,
   c) at least one patterned metal layer on the field oxide and forming an electrical component, and
   d) a sealed air-gap formed in the semiconductor body underlying the at least one patterned metal layer.

2. The passive electrical component structure as defined by claim 1 wherein the surface of the semiconductor body abutting the sealed air-gap has a silicon oxide layer thereon.

3. The passive electrical component structure as defined by claim 2 wherein the at least one patterned metal layer has a generally spiral configuration and functions as an inductor.

4. The passive electrical component structure as defined by claim 2 wherein the at least one patterned metal layer includes a first metal plate spaced from a second metal plate and functions as a capacitor.

5. The passive electrical component structure as defined by claim 1 wherein the at least one patterned metal layer has a generally spiral configuration and functions as an inductor.

6. The passive electrical component structure as defined by claim 1 wherein the at least one patterned metal layer includes a first metal layer spaced from a second metal layer and functions as a capacitor.

7. The passive electrical component structure as defined by claim 1 including a plurality of air-gaps formed in the semiconductor body underlying the at least one patterned metal layer.

8. The passive electrical component structure as defined by claim 7 wherein the at least one patterned metal layer has a generally spiral configuration and functions as an inductor.

9. The passive electrical component structure as defined by claim 7 wherein the at least one patterned metal layer includes a first metal plate formed from a second metal plate and functions as a capacitor.

10. The passive electrical component structure as defined by claim 7 wherein the surface of the semiconductor body abutting the sealed air-gap has a silicon oxide layer thereon.

11. The passive electrical component structure as defined by claim 7 wherein the semiconductor body includes a high resistivity epitaxial layer on a silicon substrate.

12. The passive electrical component structure as defined by claim 1 wherein the semiconductor body includes a high resistivity epitaxial layer on a silicon substrate.

13. The passive electrical component structure as defined by claim 1 wherein the structure has a planar surface.

* * * * *